US011894226B2

(12) United States Patent
Wu

(10) Patent No.: US 11,894,226 B2
(45) Date of Patent: Feb. 6, 2024

(54) SEMICONDUCTOR DEVICE AND METHOD MAKING THE SAME

(71) Applicant: ChangXin Memory Technologies, Inc., Hefei (CN)

(72) Inventor: Pingheng Wu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 308 days.

(21) Appl. No.: 17/432,478

(22) PCT Filed: Jun. 19, 2020

(86) PCT No.: PCT/CN2020/097084
§ 371 (c)(1),
(2) Date: Aug. 19, 2021

(87) PCT Pub. No.: WO2021/088378
PCT Pub. Date: May 14, 2021

(65) Prior Publication Data
US 2022/0139700 A1    May 5, 2022

(30) Foreign Application Priority Data
Nov. 7, 2019  (CN) .......................... 201911080521.1

(51) Int. Cl.
*H01L 21/02* (2006.01)
*H01L 21/027* (2006.01)

(52) U.S. Cl.
CPC .. *H01L 21/02118* (2013.01); *H01L 21/02002* (2013.01); *H01L 21/0274* (2013.01); *H01L 21/02345* (2013.01)

(58) Field of Classification Search
CPC ......... H01L 21/02118; H01L 21/02002; H01L 21/02345; H01L 21/0274
See application file for complete search history.

(56) References Cited

U.S. PATENT DOCUMENTS

2012/0267800 A1* 10/2012 Lin et al. ................ H01L 25/16
257/777
2012/0326337 A1* 12/2012 Camacho et al. ...... H01L 23/48
257/782

(Continued)

FOREIGN PATENT DOCUMENTS

| CN | 102130073 A | 7/2011 |
| CN | 104992909 A | 10/2015 |

(Continued)

OTHER PUBLICATIONS

PCT/CN2020/097084 International Search Report dated Sep. 24, 2020, English Translation.

(Continued)

*Primary Examiner* — William C Trapanese
(74) *Attorney, Agent, or Firm* — Alston & Bird LLP

(57) ABSTRACT

A fabrication method of a semiconductor device comprises the steps of: providing a substrate, which is divided into several chip areas; forming a protective layer on the substrate, the protective layer covers the scribe lines and the chip areas; exposing and developing the protective layer to form a plurality of grooves in the protective layer over the chip areas, and the depth of the grooves is smaller than the initial thickness of the protective layer.

8 Claims, 12 Drawing Sheets

(56) References Cited

U.S. PATENT DOCUMENTS

| | | | |
|---|---|---|---|
| 2014/0167209 A1* | 6/2014 | Meiser et al. | H01L 21/762 |
| 2015/0214077 A1* | 7/2015 | Tsai | H01L 23/3114 |
| | | | 257/737 |
| 2015/0279728 A1 | 10/2015 | Tapacio | |
| 2015/0364394 A1* | 12/2015 | Lin et al. | H01L 23/31 |
| 2016/0322343 A1* | 11/2016 | Scanlan | H01L 25/00 |
| 2021/0398854 A1* | 12/2021 | Park et al. | H01L 21/78 |

FOREIGN PATENT DOCUMENTS

| | | |
|---|---|---|
| CN | 108615706 A | 10/2018 |
| CN | 210575895 U | 5/2020 |
| WO | WO 2021/088378 A1 | 5/2021 |

OTHER PUBLICATIONS

PCT/CN2020/097084 Written Opinion of the International Searching Authority dated Sep. 24, 2020.

* cited by examiner

SEMICONDUCTOR DEVICE AND METHOD MAKING THE SAME

CROSS REFERENCES TO RELATED APPLICATIONS

This application claims the benefit of priority to CN Patent Application CN 201911080521.1 filed on Nov. 7, 2019, entitled "SEMICONDUCTOR DEVICE AND METHOD MAKING THE SAME", the contents of which are incorporated herein by reference in its entirety.

TECHNICAL FIELD

This application relates to the technical field of semiconductor device manufacturing, in particular to a semiconductor device and a manufacturing method thereof.

BACKGROUND

During semiconductor wafer manufacturing, a protective layer (for example, polyimide) is applied to the surface of the wafer as a protective layer to protect the chips formed in the wafer. At the same time, the protective layer can also be used for subsequent packaging material adjacent to molding compound layer. However, the existing protective layer is formed by a spin coating process, and the upper surface of the protective layer is almost flat, except at the opening of the testing bond pad, the surfaces of most areas in the protective layer are flat surface. However, the protective layer with a nearly flat surface has poor adhesion to the molding compound layer during the subsequent packaging, which easily causes delamination and peeling between the protective layer and the molding compounds layer, thereby affecting the performance of the device.

SUMMARY

Based on the above issue, it is necessary to overcome the poor adhesion between the protective layer and the molding compound layer from the fact that the surface of the protective layer on the wafer surface in the current technique is almost too flat, resulting in gaps between the protective layer and the molding compound layer. The problem of delamination and peeling easily occur, thereby affecting the performance of the devices. Thus, a semiconductor device and a method making it are provided.

The present application provides, according to some embodiments, a method for manufacturing a semiconductor device, which includes the following steps: providing a substrate, the substrate is divided into a plurality of chip areas; forming a protective layer on the substrate, the protective layer covers the scribe lines and the chip areas.

The protective layer is exposed and developed to form a plurality of grooves where the protective layer covers the chip areas, and the depth of each of the grooves is less than the initial thickness of the protective layer.

The above-mentioned fabrication method of the semiconductor device can increase the surface roughness and surface area of the protective layer by forming a plurality of grooves where the protective layer covers the chips, thereby improving the adhesion between the protective layer and the molding compound layer during subsequent packaging.

The present application provides, according to some embodiments a semiconductor device, including the following: a substrate, wherein the substrate is divided into a plurality of chip areas; a protective layer disposed on the substrate, wherein the protective layer comprises a first portion which covers the plurality of chip areas; and a plurality of grooves formed in the first portion of the protection layer, wherein a depth of each of the plurality of grooves is less than an initial thickness of the protection layer.

BRIEF DESCRIPTION OF THE DRAWINGS

By describing its exemplary embodiments in detail with reference to the accompanying drawings, the above and other objectives, features and advantages of the present disclosure will become more apparent.

DESCRIPTION OF REFERENCE NUMERALS

Figure 1:
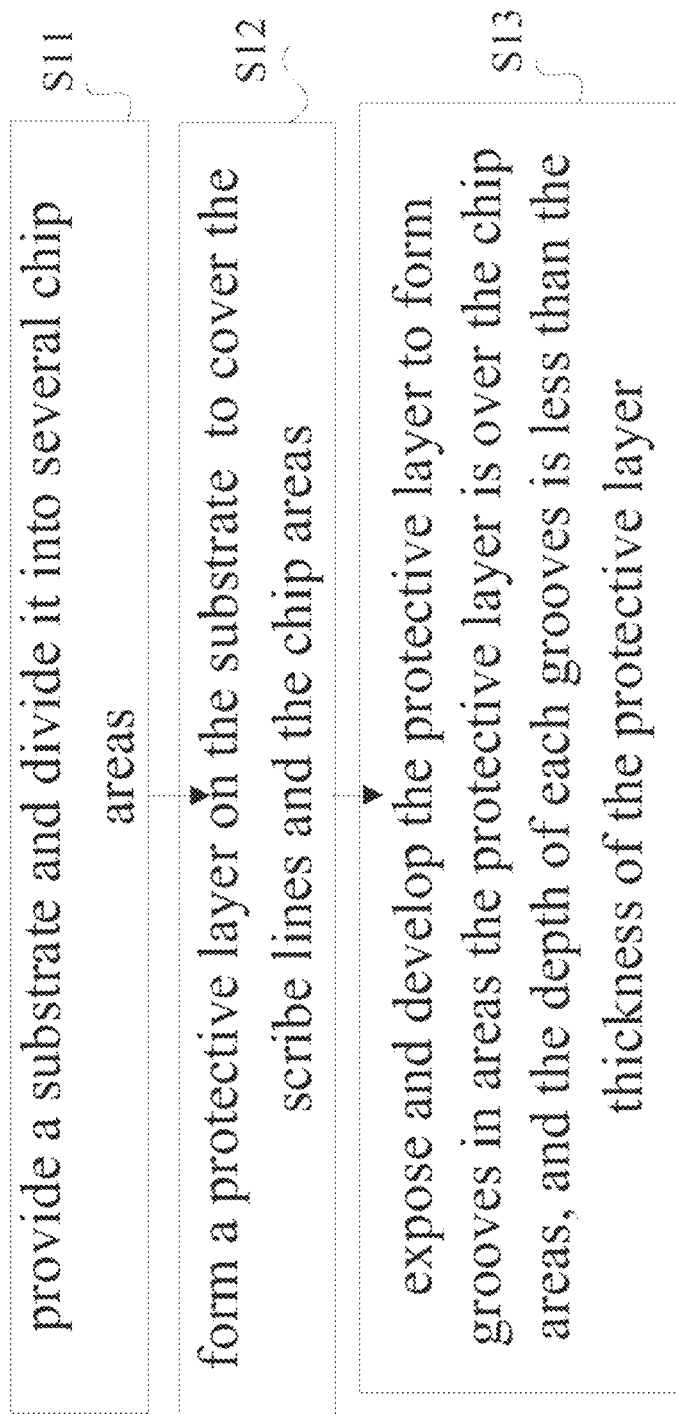
FIG. 1 is a flowchart of a method for manufacturing a semiconductor device according to an embodiment of the present application.

10 base
101 scribe line
102 chip area
111 test pad 112 metal wire
12 protective layer
121 groove
13 first photomask
131, 151 first light transmission area
14 second photomask
141, 152 second light transmission area
15 photomask
16 passivation layer
17 molding compound layer

DETAILED DESCRIPTION OF THE
PREFERRED EMBODIMENTS

In order to help with understanding this invention, the following paragraphs will make a more comprehensive description of this application with reference to the relevant drawings. The preferred embodiments of the application is shown in the accompanying drawings. However, this application can be implemented in many different forms and is not limited to the embodiments described herein. On the contrary, the purpose of providing these embodiments is to make the disclosure of this application more thorough and comprehensive.

It should be noted that when an element is considered to be "connected" to another element, it may be directly connected to and integrated with another element, or there may be a centering element at the same time. The terms "installed", "one end", "the other end" and similar expressions used herein are for illustrative purposes only.

Unless otherwise defined, all technical and scientific terms used herein have the same meaning as commonly understood by those skilled in the technical field of this application. The terminology used in the specification of the application herein is only for the purpose of describing specific embodiments, and is not intended to limit the application. The term "and/or" as used herein includes any and all combinations of one or more related listed items.

In one embodiment, as shown in FIG. 1, a method for manufacturing a semiconductor device of The present disclosure provides, according to some embodiments includes the following steps:

S11: provide a substrate and divide it into a number of chip areas;

S12: form a protective layer on chip areas on the substrate;

S13: expose and develop the protective layer to form a plurality of grooves where the protective layer covers the chip areas, and the depth of the each of the grooves is less than the thickness of the protective layer.

Figure 2:
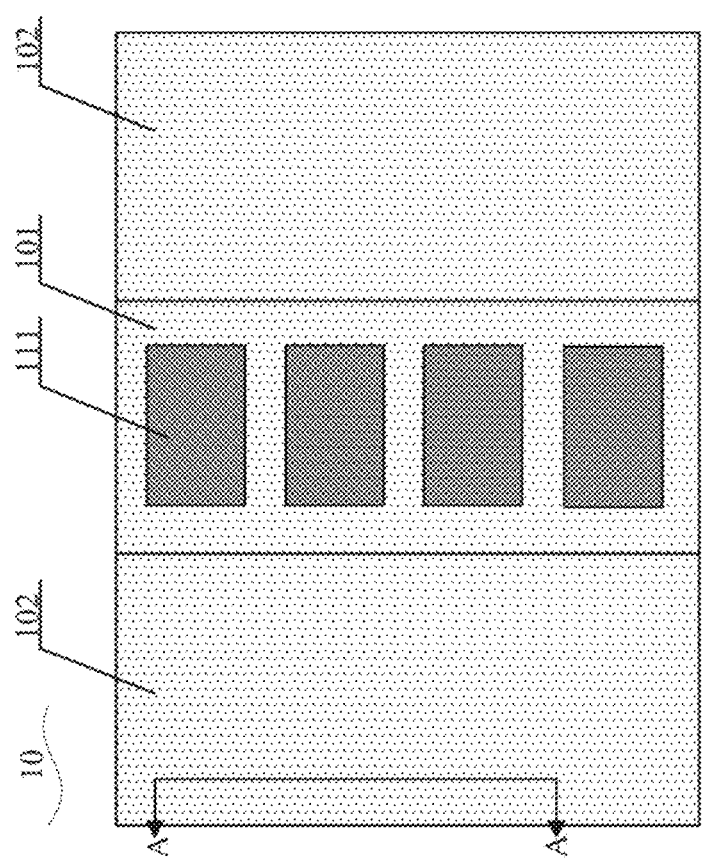
FIG. 2 is a schematic top view of a structure obtained after a substrate is provided in a method for manufacturing a semiconductor device according to an embodiment of the present application.
Figure 3:
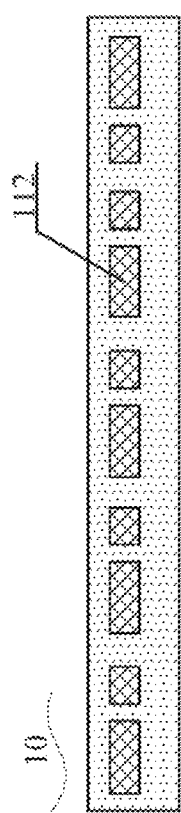
FIG. 3 is a schematic diagram of a cross-sectional view of the structure along the AA line in FIG. 2.

In an example, as shown in FIGS. 2 and 3, the substrate 10 provided in step S11 may include, but is not limited to, a silicon substrate. The substrate 10 is also formed with a scribe line 101, which divides the substrate 10 into a number of chip areas 102; the number of scribe lines 101 in the substrate and the number of chip areas 102 separated by the scribe lines 101 can be set according to actual needs. There is no limitation here.

In an example, a chip may be formed in the chip area 102, (the chip is not shown, only the metal wires 112 in the chip are shown in FIGS. 2 and 3); a test structure (not shown) may be formed in the scribe line 101, and the test pad 111 is electrically connected to the test structure, and is used to electrically lead out the test structure.

Figure 4:
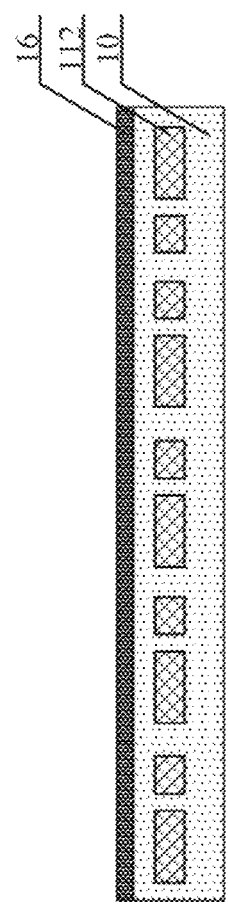
FIG. 4 is a schematic cross-sectional view of the structure obtained after the passivation layer is formed on the upper surface of the substrate in the method for fabricating the semiconductor device according to an embodiment of the present application.

In an example, after step S11, the following step further includes: forming a passivation layer 16 on the upper surface of the substrate 10, as shown in FIG. 4. The passivation layer 16 covers the chip area 102. The passivation layer 16 may include a single-layer structure or a stacked structure including multiple material layers. The passivation layer 16 may include, but is not limited to, at least one of a silicon oxide layer, a silicon nitride layer, and a silicon oxynitride layer.

Figure 5:
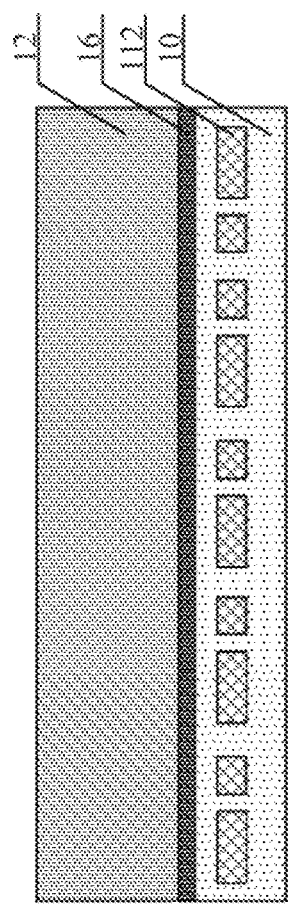
FIG. 5 is a schematic cross-sectional view of the structure obtained after a protective layer is formed on the upper surface of the passivation layer in the method for preparing a semiconductor device in an embodiment of the present application.

In an example, as shown in FIG. 5, a spin coating process can be applied, but not limited to, to form the protective layer 12 on the upper surface of the passivation layer 16.

In an example, the protective layer 12 may include any integrated circuit protective layer that can be removed by exposure and development, such as a photosensitive material layer; specifically, the protective layer 12 may include, but is not limited to, a polyimide layer or polybenzox (PBO) layer.

Figure 6:
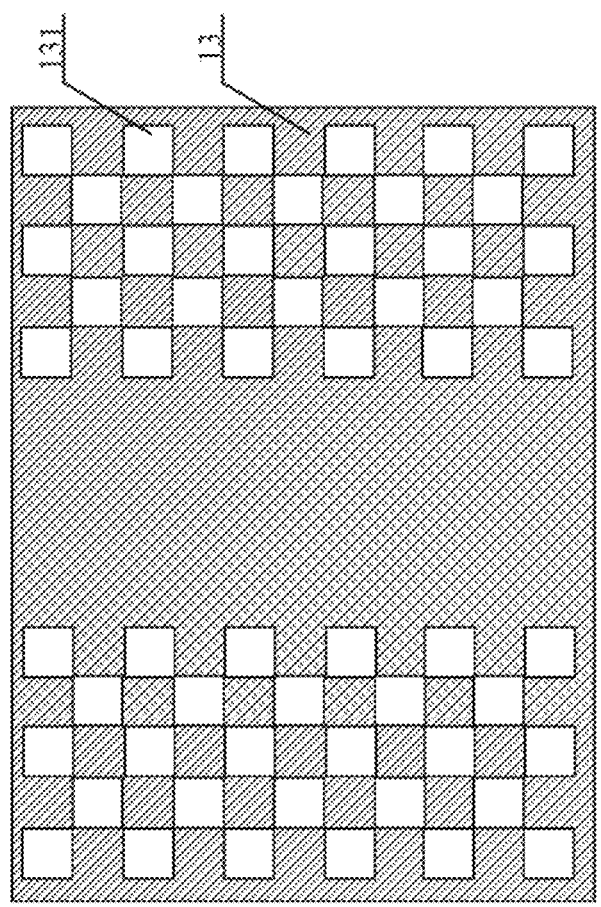
FIG. 6 is a schematic top view of the structure of the first photomask used in the process making the semiconductor device according to an embodiment of the present application.

In an optional example, step S13 may include the following steps:

S131: place the first photomask 13 above the protective layer 12. A number of the first light-transmitting regions 131 are formed in the region of the first photomask 13 which corresponds to the chip areas 102. Herein, the first photomask 13 is shown in FIG. 6. After the first photomask 13 is placed over the protective layer 12, the orthographic projection of the photomask 13 on the upper surface of the protective layer 12 covers the upper surface of the photomask 13 completely.

S132: expose, through the first photomask 13, the protective layer 12 for the first time at the first exposure dose or the first exposure energy.

S133: develop the exposed protective layer 12: the removed thickness after the development from the protective layer 12 in the exposed area of the first exposure is smaller than the thickness of the protective layer 12.

Figure 7:
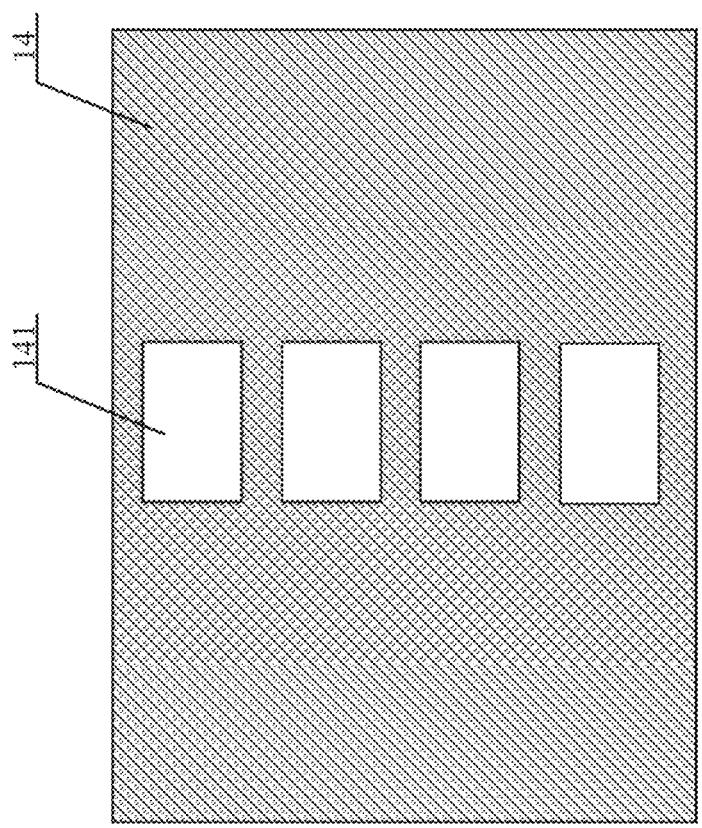
FIG. 7 is a schematic top view of the structure of a second photomask provided in the process for manufacturing the semiconductor device according to an embodiment of the present application.

In an example, when the test pad 111 is formed in the scribe line 101, step S132 and step S133 further include the following steps:

Remove the first photomask 13; place the second photomask 14 over the protective layer 12. The second photomask 14 has a second light-transmitting area 141 formed in the area corresponding to the test pad 111. The second photomask 14 is shown in the FIG. 7. After the second mask 14 is placed above the protective layer 12, the orthographic projection of the second mask 14 on the upper surface of the protective layer 12 covers the upper surface of the protective layer 12 completely.

The protective layer 12 is exposed for the second time using the second photomask 14 at the second exposure dose or the second exposure energy. Apply the second exposure dose at a minimum exposure dose which enables the protective layer 12 in the second exposure area completely removed after subsequent development, or apply the second exposure energy at a minimum exposure energy which enables the protective layer 12 in the second exposure area completely removed after subsequent development. The second exposure dose is greater than the first exposure dose, and the second exposure energy is greater than the first exposure energy.

Since the first exposure dose or the first exposure energy is relatively small, the first exposure using the first photomask 13 generates exposure depth at the first transparent region 131 smaller than the thickness of the protective layer 12, so only part of the depth of the protective layer 12 is removed during the development of the exposed area after the first exposure. After the development, the protective layer 12 includes a number of grooves in an chip area 102 that corresponds to the first exposed area 131, shown in FIGS. 8 and 9. During the second exposure, the second exposure dose or the second exposure energy from the second mask 14 is larger, so the protective layer 12 of the exposed area after the second exposure can be removed completely during the development process, thus, the area in the protective layer 12 where the test pad 111 needs to be opened is completely removed after the development.

In an example, the depth of the groove 121 can beset according to actual needs, however the depth of the groove 121 cannot be too deep or too shallow; preferably, in this embodiment, the depth of the groove 121 can be set in a range of ⅓-¾ of the thickness of the protective layer 12; if the depth of the groove 121 is less than ⅓ of the thickness of the protective layer 12, it will not have the effect of enhancing bonding, and if the depth of the groove 121 is larger than ¾ of the thickness of the protective layer 12, it may damage the structural stability of the device itself.

In an example, the plurality of the first light-transmitting regions 131 may be arranged in strips at intervals, cross-shaped or randomly distributed; specifically, the random arrangement of the plurality of first light-transmitting regions 131 may be the first transparent regions. The shapes of the first light-transmitting regions 131 are the same, but the first light-transmitting regions 131 are arranged in a disorderly manner. It can also be that the shapes of the first light-transmitting regions 131 vary, and the plurality of first light-transmitting regions 131 are arranged in a disorderly manner, and so on.

In an example, after step S13, the following steps are further included:

S14: cure the protective layer 12; specifically, the protective layer 12 can be cured by but not limited to baking;

S15: etch and remove the passivation layer 16 where the test pad 111 is and part of the substrate 10 to expose the test pad 111, so the upper surface of the test pad 111 will be exposed after etching; an etching process can be applied to remove the passivation layer 16 corresponding to the test pad 111 and part of the substrate 10, but the technique is not limited to etch.

Figure 10:
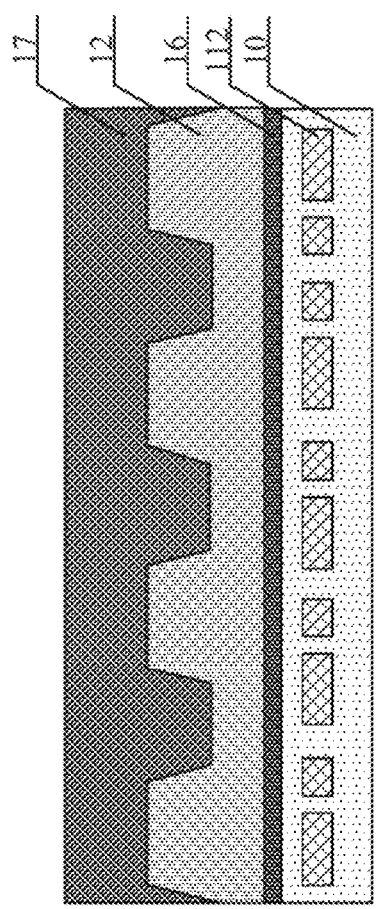
FIG. 10 is a schematic cross-sectional view of the structure obtained after a molding compound layer is formed on the upper surface of the exposed protective layer during the process for making a semiconductor device according to an embodiment of the present application.

In an example, after step S15, the method may further include the following step of forming a molding compound layer 17 on the upper surface of the protective layer 12. Herein the thickness of the molding compound layer 17 is greater than the depth of the groove 121, as shown in FIG. 10.

Figure 11:
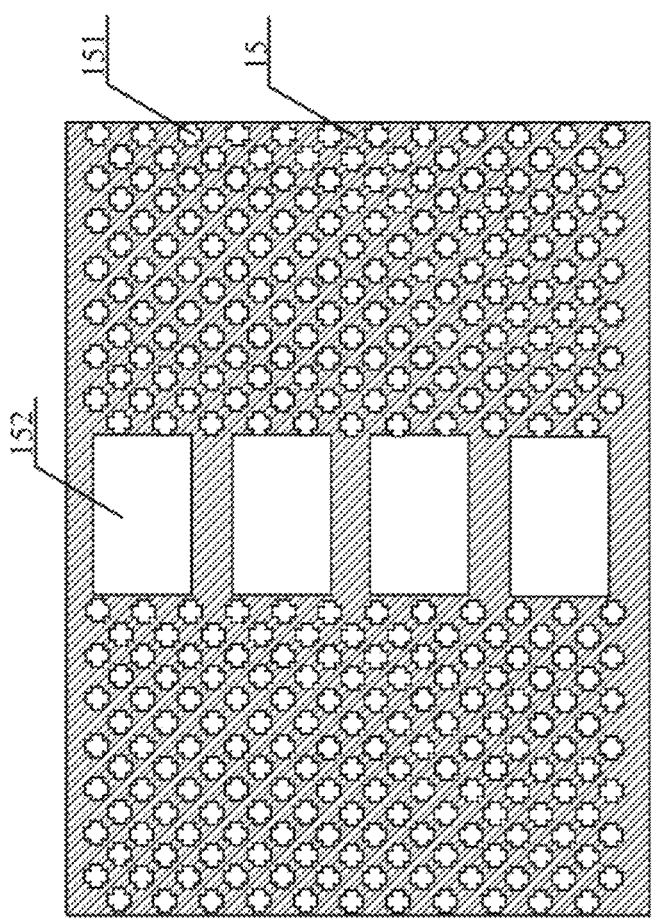
FIG. 11 is a schematic top view of the structure of the photomask used in the process of fabricating the semiconductor device according to another embodiment of the present application.

In another optional example, as shown in FIG. 11, step S13 may further include the following step:

S131: place the photomask 15 above the protective layer 16. A number of the first light-transmitting regions 151 are formed in the photomask 15 in the chip areas 102; the photomask 15 is shown in FIG. 11; the photomask 15 is placed After the upper surface of the protective layer 12, the orthographic projection of the photomask 15 on the upper surface of the protective layer 12 can completely cover the upper surface of the protective layer 12;

S132: Expose the protective layer 12 based on the photomask 15;

S133: developing the exposed protective layer 12; after developing, the protective layer 12 at locations where the first light-transmission area 151 is will be thinned and the removed thickness of the protective layer 12 will be less than the thickness of the protective layer 12.

In an example, when the test pad 111 is formed in the scribe line 101, the second light-transmitting area 152 providing the test pad 111 is also formed in the area of the photomask 15. The second light-transmitting area 152 corresponds to the area of the protective layer 12 which is completely removed after development.

Figure 12:
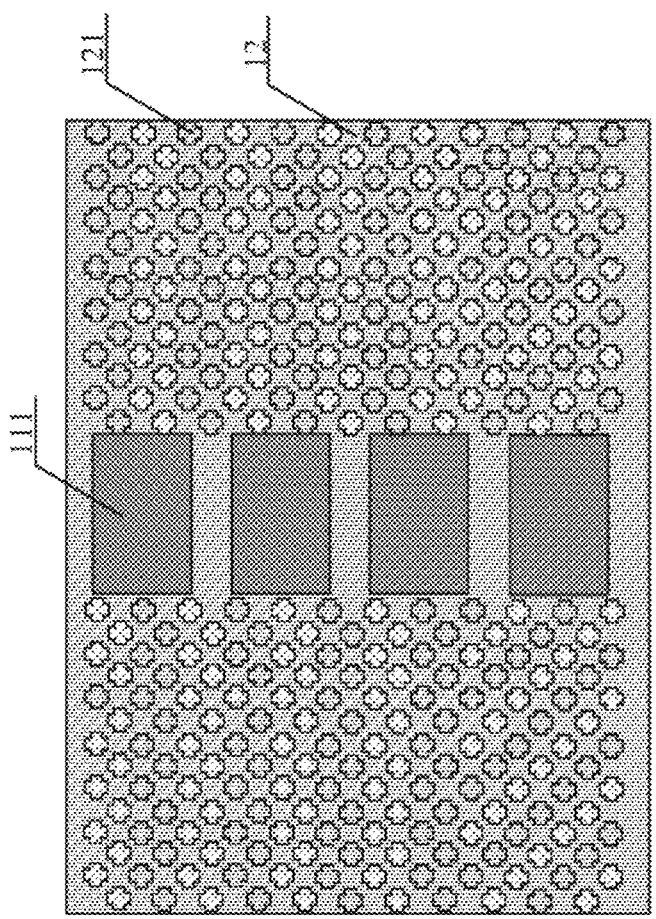
FIG. 12 is a schematic top view of a structure obtained after exposure using the photomask shown in FIG. 11 in a process for making the semiconductor device according to another embodiment of the present application.

Since the individual size of the first light-transmitting area 151 is very small, the depth of the protective layer 12 exposed by the first light-transmitting area 151 is smaller than the depth of the protective layer 12 during the exposure process due to the diffraction of the exposure light. During the process, the protective layer 12 in the exposure area of the first light-transmitting area 151 is only removed partially to a shallow depth, that is, after development, the protective layer 12 corresponding to the first light-transmitting area 151 is formed with a number of grooves 121 in the light-transmitting region 151, as shown in FIG. 12.

The above-mentioned fabrication method of the semiconductor device can increase the surface roughness and surface area of the protective layer 12 by forming a plurality of grooves 121 in the chip area 102 covered by the protective layer 12, so that after the molding compound layer 17 is formed on the upper surface of the protective layer 12 the adhesion between the protective layer 12 and the molding compound layer 17 is increased.

Continue to refer to FIGS. 8 to 10 and 12 for another embodiment. According to another embodiment a semiconductor device is provided. The semiconductor device includes: a substrate 10, the substrate 10 is divided into a plurality of chip regions 102; a protective layer 12, a protective layer 12 is located on the substrate 10 and covers the chip area 102; a plurality of grooves 121 are formed in the area where the protection layer 12 covers the chip area 102, and the depth of the grooves 121 is less than the thickness of the protection layer 12.

In one example, the substrate 10 may include, but is not limited to, a silicon substrate. A scribe line 101 is also formed in the substrate 10, and the scribe line 101 divides the substrate 10 into a number of chip areas 102; the number of scribe lines 101 in the substrate 10 and the number of chip areas 102 separated by the scribe line 101 can be set according to actual needs and are not limited here.

Figure 8:
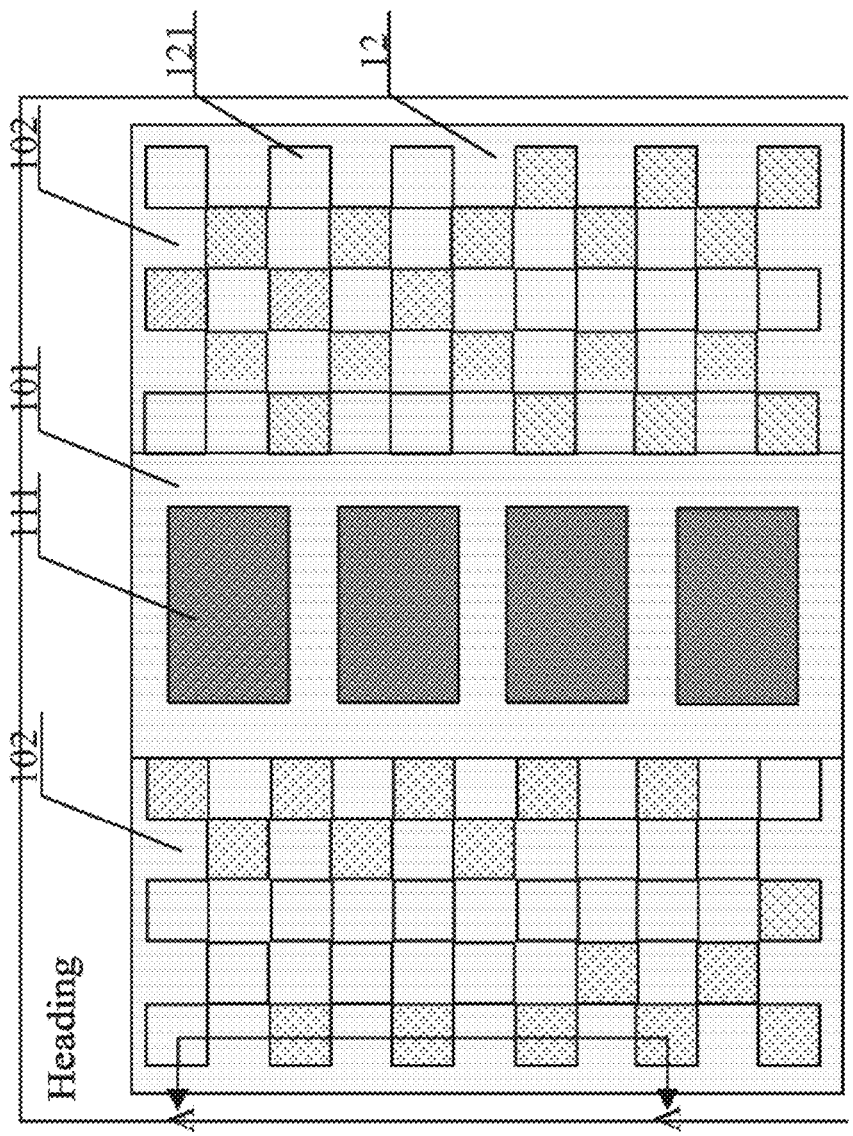
FIG. 8 is a schematic top view of the structure obtained after exposure and development of the first photomask and the second photomask in the process for manufacturing the semiconductor device according to an embodiment of the present application.
Figure 9:
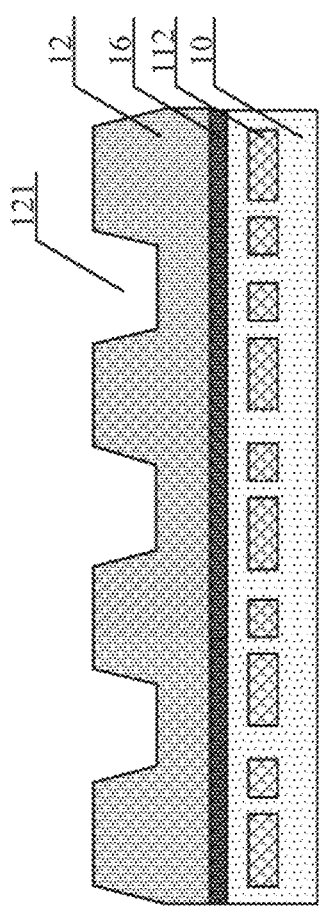
FIG. 9 is a schematic diagram of a cross-sectional view of the structure along the AA line in FIG. 8.

In an example, a chip may be formed in the chip area 102 (not shown, only the metal wires 112 in the chip are shown in FIGS. 8 and 10): a test structure (not shown) may be formed in the scribe line 101, and the test pad 11 is electrically connected to the test structure underneath, and is used to electrically lead out the test structure.

In an example, the protective layer 12 may include a protective layer containing integrated circuits and can be removed by exposure and development, such as a photosensitive material layer; specifically, the protective layer 12 may include, but is not limited to, a polyimide layer or a polybenzox (PBO) layer.

In an example, a plurality of grooves 121 may be arranged in strips at intervals, connected to each other in a grid-like pattern or irregularly distributed.

In an example, the depth of the groove 121 can be set according to actual needs, but it cannot be too deep or too shallow. Preferably, in this embodiment, the depth of the groove 121 can be ⅓-¾ of the thickness of the protective layer 12. If the depth of the groove 121 is less than ⅓ of the thickness of the protective layer 12, it will not have the effect of enhancing the bonding, and if the depth of the groove 121 is greater than ¾ of the thickness of the protective layer 12, it may damage the structural stability of the device itself.

In an example, the semiconductor device further includes a passivation layer 16, the passivation layer 16 is located on the upper surface of the substrate 10, and the protective layer 12 is located on the upper surface of the passivation layer 16. The passivation layer 16 covers the scribe line 101 and the chip area 102. The passivation layer 16 may include a single-layer structure or a stacked structure including layers of multiple materials. The passivation layer 16 may include, but is not limited to, at least one of a silicon oxide layer, a silicon nitride layer, and a silicon oxynitride layer.

In one example, when the test pad 111 is formed in the scribe line 101, an opening (not shown) is also formed in the protective layer 12, and the opening penetrates the protective layer 12, the passivation layer 16, and extends into the substrate 10 to expose the test pad 111.

In an example, the semiconductor device further includes a molding compound layer 17, which covers the upper surface of the protective layer 12, and the thickness of the molding compound layer 17 is greater than the depth of the groove 121.

The protective layer 12 in the above semiconductor device covers the chip area 102 and forms a plurality of grooves 121, which can increase the surface roughness and surface area of the protective layer 12, so that after adding the molding compound layer 17 on the upper surface of the protective layer 12, the two layers adhere better.

The technical features of the above-mentioned embodiments can be combined arbitrarily. In order to make the description concise, not all possible combinations of the various technical features of the above-mentioned embodiments are described. However, as long as there is no contradiction in the combination of these technical features, they should be considered as within the range described in this specification.

The above-mentioned embodiments only express several implementation manners of the present application, and the description is relatively specific and detailed, but it should not be understood as a limitation on the scope of patent application. It should be pointed out that for those of ordinary skill in the art, without departing from the concept of this application, several modifications and improvements can be made, and these all fall within the protection scope of this application. Therefore, the scope of protection of the patent in this application shall be subject to the appended claims.

The invention claimed is:

1. A method for manufacturing a semiconductor device, comprising:
   providing a substrate, wherein the substrate is divided into a plurality of chip areas by scribe lines, wherein the scribe lines comprise test pads;
   forming a protective layer on the substrate, wherein the protective layer comprises a first portion and a second portion, wherein the first portion covers the plurality of chip areas, wherein the second portion covers the scribe lines;
   performing a first lithography with a first photomask to expose and develop the first portion of the protective layer to form a plurality of grooves, wherein a depth of each of the plurality of grooves is less than an initial thickness of the protective layer;
   performing a second lithography with a second photomask to expose and develop the second portion of the protective layer to form test pads; and
   performing a third lithography with a third photomask to further expose and develop the first portion of the protective layer for the plurality of chip areas and the second portion of the protective layer for test pads.

2. The method for manufacturing the semiconductor device according to claim 1, wherein the exposing and developing lithographically of the first portion of the protective layer to form the plurality of grooves comprises following steps:
   placing the first photomask above the protective layer, wherein a plurality of first light-transmitting regions is configured in the first photomask for the first portion of the protective layer; and
   performing the first lithograph comprising a first exposure and a first development of the first portion of the protective layer with the first photomask at a first exposure dose or a first exposure energy;
   wherein a thickness of the first portion of the protective layer after the first development is less than the initial thickness of the protective layer.

3. The method for manufacturing the semiconductor device according to claim 2,
   wherein after the first exposure and before the first development, the method further includes following steps:
   removing the first photomask;
   placing the second photomask above the second portion of the protective layer, wherein a plurality of second light-transmitting regions for exposing test pads is configured in the second photomask for the second portion of the protective layer; and
   performing the second lithography comprising a second exposure and a second development of the second portion of the protective layer with the second photomask at a second exposure dose or a second exposure energy;
   wherein the second exposure is performed with a minimum second exposure dose or a minimum second exposure energy to remove the exposed second portion of the protective layer;
   and
   wherein the minimum second exposure dose or the minimum second exposure energy is greater than the first exposure dose or the first exposure energy respectively.

4. The method for manufacturing the semiconductor device according to claim 1, wherein the first exposure and the first development on the first portion of the protective layer to form the plurality of grooves further comprises a step of:
   placing the third photomask above the protective layer, wherein the third photomask comprises a plurality of third light-transmitting regions formed corresponding to the plurality of chip areas, and each of the plurality of third light-transmitting regions includes a plurality of first light-transmitting regions; and
   wherein the third photomask is used to expose the protective layer followed by a third development; and
   wherein a thickness of the protective layer in the plurality of third light-transmitting regions is less than the initial thickness of the protective layer.

5. The method for manufacturing the semiconductor device according to claim 2, wherein the plurality of the first light-transmitting regions is arranged in strips at intervals, in a grid, or irregularly.

6. The method for manufacturing the semiconductor device according to claim 4, wherein the protective layer covers the test pads; wherein the third photomask comprises the second light-transmitting regions formed at an area corresponding to the test pads; wherein the protective layer corresponding to the second light-transmitting regions is completely removed.

7. The method for manufacturing the semiconductor device according to claim 3, further comprising:
   before forming the protective layer on the substrate, forming a passivation layer on an upper surface of the substrate, wherein the protective layer is formed on an upper surface of the passivation layer;

after the second exposure, curing the protective layer; and etching to remove a part of the passivation layer and a part of the substrate corresponding to the test pads to expose the test pads.

8. The method for manufacturing the semiconductor device according to claim 1, wherein after forming the plurality of grooves in the first portion of the protective layer, the method further comprises forming a molding compound layer on an upper surface of the protective layer, wherein a thickness of the molding compound layer is greater than the depth of each of the plurality of grooves.

* * * * *